United States Patent [19]

Schertler

[11] Patent Number: 5,245,736

[45] Date of Patent: Sep. 21, 1993

[54] VACUUM PROCESS APPARATUS

[75] Inventor: Roman Schertler, Wolfurt, Austria

[73] Assignee: Balzers Aktiengesellschaft, Liechtenstein, Liechtenstein

[21] Appl. No.: 888,111

[22] Filed: May 26, 1992

[30] Foreign Application Priority Data

May 31, 1991 [DE] Fed. Rep. of Germany ....... 4117969

[51] Int. Cl.$^5$ .......................... B23B 15/00; B25B 11/00
[52] U.S. Cl. ...................................... 29/33 P; 29/563; 29/559; 269/21
[58] Field of Search .......................... 29/33 P, 563, 559; 269/21, 57, 61; 279/3

[56] References Cited

U.S. PATENT DOCUMENTS 3,915,117  10/1975  Schertler .......................... 118/719 X
4,652,135   3/1987  Ono .................................. 269/21 X

FOREIGN PATENT DOCUMENTS

0136562  2/1983  European Pat. Off. .
0161927  11/1985 European Pat. Off. .
0389820  3/1990  European Pat. Off. .
0130144  6/1987  Japan .............................. 269/21
0973293  11/1982 U.S.S.R. .......................... 269/21

Primary Examiner—Joseph M. Gorski
Assistant Examiner—Khan V. Nguyen
Attorney, Agent, or Firm—Evenson, McKeown, Edwards & Lenahan

[57] ABSTRACT

The invention proceeds from a vacuum process apparatus for an article which is processed or treated, resp. at two stations, whereby each station has a charging and-/or removing opening for the article. A transporting device is supported for rotation and includes a supporting portion which is successively moved onto the openings of the stations. The process plant is designed in such a manner that the surface normals determined by the surfaces of the openings and the space axis defined by the axis of rotation of the transport device do not run parallel and rather enclose together an angle of 90° or 45°. By such an arrangement it is possible to design extremely compact vacuum vapor deposition apparatuses having a plurality of individual stations, whereby additionally short transporting distances are obtainable and the volumes to be conditioned can be minimized.

29 Claims, 5 Drawing Sheets

VACUUM PROCESS APPARATUS

BACKGROUND OF THE INVENTION

1. Field of the Invention

The present invention relates to a vacuum process apparatus of the kind, including at least two stations for treating or handling the workpiece, and a transport device with conveyor means thereon, each for transporting at least one workpiece from station to station.

2. Description of the Prior Art

Figure 1:
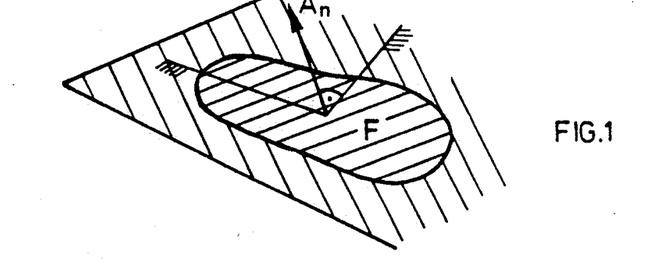
FIG. 1 is a schematic illustration for explaining the relative position of opening, opening area and of the normal thereon.

The German specification DE-A-24 54 544 and "Patent Abstracts of Japan", Nov. 28, 1989, vol. 13, no. 532, JP-A2 1-218 627, disclose as an example such a vacuum process apparatus which includes at least two stations, each comprising an opening for an article, the openings each determining an opening area with surface normal $A_n$ perpendicular to the opening area F such as illustrated in FIG. 1 for sake of clarity. The said apparatus further includes a transport device which is supported and driven to rotate around a space axis as rotational axis and includes at least one conveyor portion for an article, whereby the conveyor portion is moved consecutively to and from the openings of the stations.

In contrary to the design of the apparatus according to the JP-1-218627, the transport device of which comprising only one conveyor portion for an article and whereat the conveyor portion is rigidly fixed on a rotatable cylinder forming the transport device, the apparatus according to the German patent no. 24 54 544 comprises four conveyor portions for articles. These conveyor portions are additionally movable with respect to the transport device. By means of a driving plunger there is realized for each conveyor portion an individual drive for moving the said conveyor portion of the transport device relative to a respective station.

Thus, according to the apparatus of the German patent no. 24 54 544, the conveyor portion may be positioned at different positions with respect to a respective station, according to the specific requirements of a process performed at the station considered, up to providing for a sealing closure of the said opening by means of the conveyor portion.

Provision of the said driving plungers which are led through the wall of the vacuum recipient has different drawbacks:

a) For every driving plunger there must be provided a dynamic gliding vacuum seal which results in a considerable additional expenditure for the apparatus in view of vacuum technical requirements for such dynamic seals.

b) The said driving plungers are individually associated to respective stations. Thus, if an apparatus or vacuum plant shall be changed by changing the number of process stations mounted thereon and especially shall be changed by raising the number of such process stations provided, the complete apparatus with its vacuum recipient must be changed according to the changing number of vacuum tight mounted driving plungers.

It is a first object of the present invention to remedy these drawbacks and to provide a vacuum process apparatus which comprises a self-comprised transport device which may flexibly be used for a great number of different apparatus configurations with respect to the number of the process stations provided.

The design of vacuum process apparatuses according to the DE-A-24 54 544 which have established themselves on the market has the further drawback that the rotational axis around which the transport device is rotatable extends parallel to the normals of the opening areas. Thereby the openings of the stations are distributed equidistantly around the rotational axis i.e. the rotational axis of the transport device, so that, as an advantage, the openings of the stations can be served solely by a pivoting movement of the transport device around the rotational axis. Nevertheless, it is disadvantageous that when designing the vacuum process apparatus, there is a restriction in constructional freedom, in that the individual stations must be located with the said normals of their opening areas extending parallel to the rotational axis of the transport device. This necessitates that the stations must be arranged in one given orientation with respect to the transport device, possibly may be provided at both sides of the plane swept over by the transport device of said DE-A-24 54 544.

It is thus a further object of the present invention to remedy this drawback and to provide a vacuum process apparatus with a transport device-to station openings-relation which allow a significantly improved constructional freedom for such apparatus.

SUMMARY OF THE INVENTION

It is thus a first object of the present invention to provide a vacuum process apparatus of the kind mentioned above which comprises a transport device which may be used flexibly for different apparatus configurations as concerns number of treating or handling stations provided thereon.

It is a further object to provide a vacuum process apparatus which gives a high degree of constructional freedom with respect to the arrangement of the said stations as concerns their orientation in space and especially the spatial arrangement of their respective openings. Thereby it shall be made possible to vastly increase the compactness of such process apparatuses, thereby optimizing assembly, disassembly, operation cycle time etc.

A further object of the invention is to provide a vacuum process apparatus for processing at least one workpiece, comprising at least two stations for treating or handling said workpiece, and having each at least one opening for the workpiece; a transport device rotatable around an axis; a drive arrangement for rotating said transport device; at least two conveyor means arranged at said transport device for at least one workpiece each; driving means at said transport device respectively coupled to said conveyor means to individually move said conveyor means relative to said transport device towards and from said openings.

By providing such a vacuum process apparatus the disadvantages of the prior art apparatus as concerns lack of flexibility with respect to arranging more or less of the said stations at the apparatus are remedied and further the self-contained transport device with conveyor means and said driving means enables to drive said conveyor means without necessity of frictional seals at the process apparatus vacuum chamber wall, through which, according to prior art, such driving means did act on the conveyor means of the known transport device.

It is still an object of the present invention to provide said apparatus with openings defining an opening area each, the normals on said areas being warped with respect to said rotational axis.

It has been recognized basically that, when providing a transporting device which is rotatable around the said axis and wherearound the openings of the said stations are arranged so that the normals on the areas defined by the respective borders of said openings are warped with respect to the said rotational axis, a highest grade of constructional flexibility is gained in order to design apparatuses more compact and/or to produce smallest possible spaces to be evacuated and/or to minimize cycle time of processing due to minimizing the conveyant distance between respective openings of the stations.

It is yet a further object to provide the said apparatus wherein said conveyor means are movable at least one of parallel to said axis and of radially to said axis. Thereby, departing from the rotational axis of the transport device, by appropriate selection of the movability of the said conveyor means, parallel and/or radial with respect to said axis, it becomes possible to reach openings of the said stations arranged with respect to the rotational axis in a great variability of different positions.

A further object of the present invention is to provide said apparatus wherein said conveyor means, once positioned adjacent one of said openings by rotating said transport device, are movable towards and from said opening in a direction given by the normal on the opening area defined by the said opening. Thereby an even simplified apparatus is realized in that it becomes possible to convey a workpiece disposed on the conveyor means considered straight ahead towards or into or through the opening of a station considered.

Yet a further object is to provide the said apparatus wherein rotation of the transport device around the rotational axis defines a cone-shaped trajectory surface with a cone opening angle with respect to the said rotational axis smaller or equal than 90°.

Although the inventive transport device can, if necessary, sweep over selectably variable conical surfaces, in that the cone angle $\phi$ is drivingly changed, it has been recognized that a substantial simplification may be reached without any substantial loss with respect to flexibility by the facts that the transport device comprises a transport arm for each of the said conveyor means which arms projecting from the said rotational axis. If the transport device structure with the said transport arms sweeps a conical trajectory surface with an opening angle with respect to the rotational axis up to 90°, by controllably changing the extent of the said transport arms with the conveyor means, station openings may be served along the said conical trajectory surface and located on different great circles of the said cone surface. Thereby, the arms advantageously comprise the said driving means.

Furthermore, the normals on the opening areas of the station openings must not necessarily extend in the direction of the generatrix lines of the conical trajectory surface. These normals can rather extend in an arbitrary direction and in this case at least the conveyor means are accordingly pivoted to finally serve respective openings.

It is, nevertheless, a further object to provide said vacuum process chamber wherein the said normals of said areas point in direction of respective generatrix lines of the trajectory cone surface. This leads to a further simplification of the apparatus, in that linear movement of the said conveyor means in direction of said transport arms will suffice to respectively serve the station openings.

Even in this case it is still possible to stagger the openings of the stations along different great circles of the conical trajectory surface. This is nevertheless not always necessary and may lead to problems in that stations staggered on different great circles and with openings along the same generatrix and thus substantially aligned in generatrix direction may cover each other, making access to the said openings by said conveyor means more difficult.

It is, thus, a further object of the invention to provide a vacuum process apparatus in which the said openings of the stations are located substantially along one single great circle of the trajectory cone surface.

It is still a further object of the present invention to provide a vacuum process apparatus in which the stations communicate by the said openings with the inside of a chamber, said transport device residing within the said chamber. On one hand, by such a design the transport device is protected and further the danger of contamination of the atmosphere prevailing within the stations is decreased because, as mentioned, the openings of the stations communicate with the chamber.

Depending from the desired process or treatment performed within the respective stations, it is a further object to provide the vacuum process apparatus which comprises gas inlet means and pumping means, at least at one of the said stations and of the said chamber.

By providing such gas inlets and pumping means selectively at the said stations and/or the said chamber, one has the freedom to perform with the apparatus different vacuum processes which are allowed or are not allowed to influence each other by atmosphere communication.

It is yet a further object of the invention to provide an apparatus whereon at least one of said conveyor means is coupled to a seal member for sealingly closing the opening of at least one of the said stations. Thereby it becomes possible to sealingly close the respective station which is advantageous if in that station a vacuum process shall be performed which necessitates a clearly defined gaseous atmosphere. The seal member may be formed by a plate-like member of the conveyor means.

Further, the said plate or disk-like member may form one door of a charging or discharging load lock for a workpiece to be charged or discharged with respect to the said chamber or the said plate may be the workpiece support feeding the workpiece through the station opening of a sputtering station whereby the seal member sealing the sputtering station against the chamber wherein the transport device is disposed.

BRIEF DESCRIPTION OF THE DRAWINGS

The invention will be better understood and objects other than those set forth above, will become apparent when consideration is given to the following detailed description thereof. Such description makes reference to the annexed drawings wherein.

DESCRIPTION OF THE PREFERRED EMBODIMENT

Figure 2:
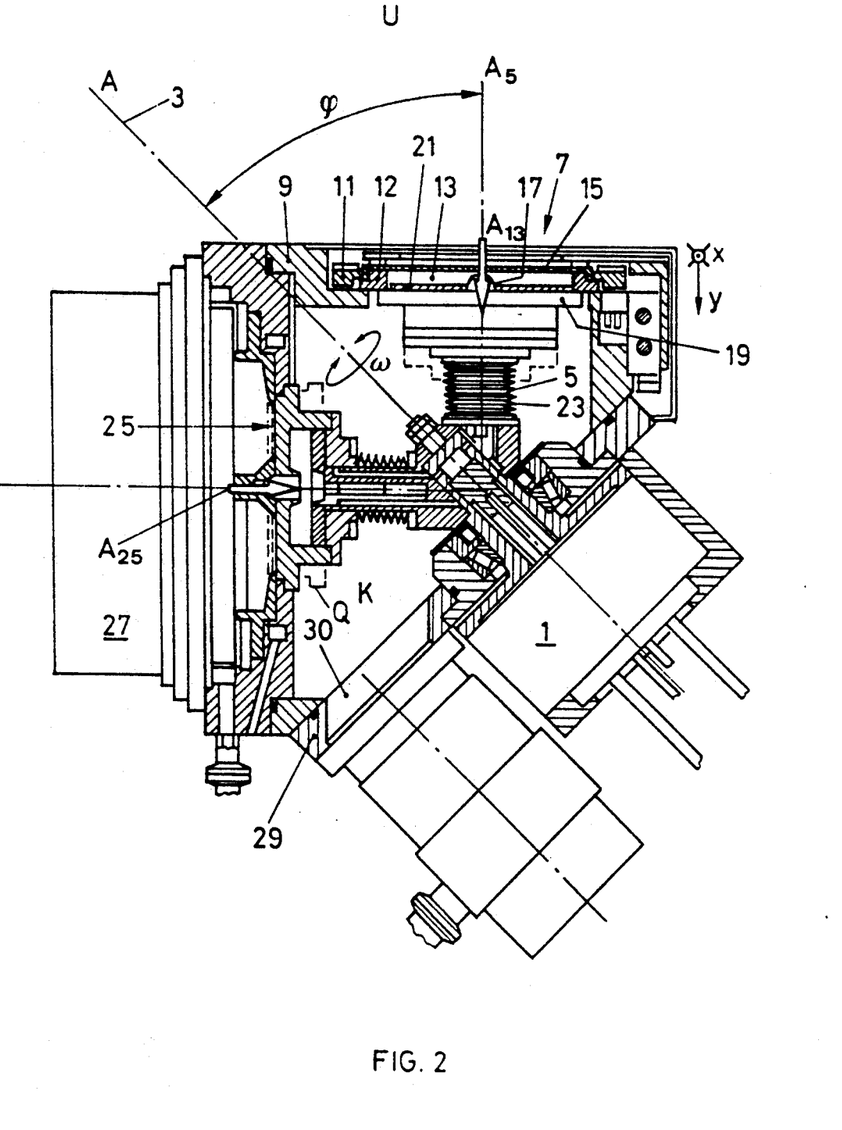
FIG. 2 is a sectional view of a presently preferred embodiment of the inventive vacuum process apparatus.

FIG. 2 is an illustration designed in section of an inventive vacuum process apparatus in a first configuration. It includes a drive motor 1 on the axis A as physical drive axis 3, to which at least one transport arm 5 is mounted. The axis $A_5$ of the arm 5 extends at an angle, for instance of 45° relative to the rotation axis A. If the drive axis 3 is caused to rotate by means of the motor 1 such as indicated by $\omega$, the transport arm(s) 5 sweeps over a conical trajectory surface having a cone angle $\phi$ of 45°. Two stations are illustrated in FIG. 2. A first station 7 is for instance and as illustrated designed as load lock. It includes a first frame 9 and a second frame 11 which can be moved upwards and downwards and which is flanged onto the first frame 9. Inside of the drivingly upwards and downwards movable frame 11 a sealing frame 12 is provided which determines the opening 13 of the station and thus its area, having a surface normal $A_{13}$ of said area. The lock station 7 includes a cover 15 which is linearly displaceable in the direction x. Quite obviously it also can be pivotable for opening and closing, around a vertical axis in FIG. 2. In its closed, illustrated position it is placed sealingly onto the sealing frame 12 by a lowering of the intermediate frame 11 in the direction y.

Thus, the lock station 7 becomes sealed against the environment U.

The transport arm 5 carries at one end as conveyor portion a disk or plate 19 on which an article to be processed rests, in the illustrated example a CD or a magneto-optical storage disk 21, centered at the plate 19 by a central pin 17. As shown by broken lines the plate 19 at the supporting arm 5 can be moved back from its seat (illustrated) at the sealing frame 12 towards the rotation axis A and thus the lock may be opened at the side of the transport device. Because the transport device 3, 5, 19 of the apparatus illustrated in FIG. 2 is located in a vacuum tight chamber K the plate 19 must here not necessarily contact the frame 12 in a sealed manner. This situation is obviously different when the chamber K itself is not vacuum tight. The article 21 is conveyed by the transport arm by rotating of the shaft 3 by means of the motor 1 towards the second station 27 illustrated. The driving arrangement at the transport arm 5, the specific construction thereof not forming part of the present invention, and for which various possibilities regarding its design will come to mind to the person skilled in the corresponding art, is sealed by a bellows 23 in a vacuum tight manner against the interior of the chamber K. By rotating of the transport arm 5, the article, namely e.g. the disk 21, is transported into the area of an opening 25 of the second illustrated station 27. The opening 25 determines the surface normal $A_{25}$ of the opening area. From the approach position Q illustrated by broken lines, the conveyor plate 19 with the disk 21 is again raised into the position illustrated by full lines by means of the mentioned, for instance pneumatic driving arrangement or mechanism at the arm 5, such that the plate comes to contact, now e.g. in a sealed manner, the edge of the opening 25 of the station 27 which for instance can be designed as a known etching or coating station.

FIG. 2 illustrates that on the one hand the stations 7 and 27 and the flange 29 of the motor 1 are interconnected in such a manner that they encase the closed chamber K in which the transport device with its arm(s) 5 moves. The chamber K for the transport device is preferably structured vacuum tight against the environment U. Depending from the prevailing application or operation units (not illustrated) are foreseen at the station 27 and/or at the chamber K and/or at the station 7 which produce respective atmospheres in an aimed manner. Thus, i.e. lines for evacuation and/or gas inlets are foreseen to the stations 7 and/or 27 and/or to the chamber K. A pumping connection 30 for the chamber K and a gate 7 are illustrated in FIG. 2 as an example.

If the apparatus is designed in such a manner that some or all station openings are sealingly closed by one of the arms 5 foreseen, this leads to the possibility of presetting the respective atmospheres in the respective individual stations independently from the atmosphere in the chamber K. In certain cases, however, it will be absolutely sufficient to foresee a common atmosphere for the stations and the chamber K for the transporting device, so that only the chamber must be conditioned or evacuated, such as for example illustrated in FIG. 2, the chamber K beside the load lock station 7.

Figure 3:
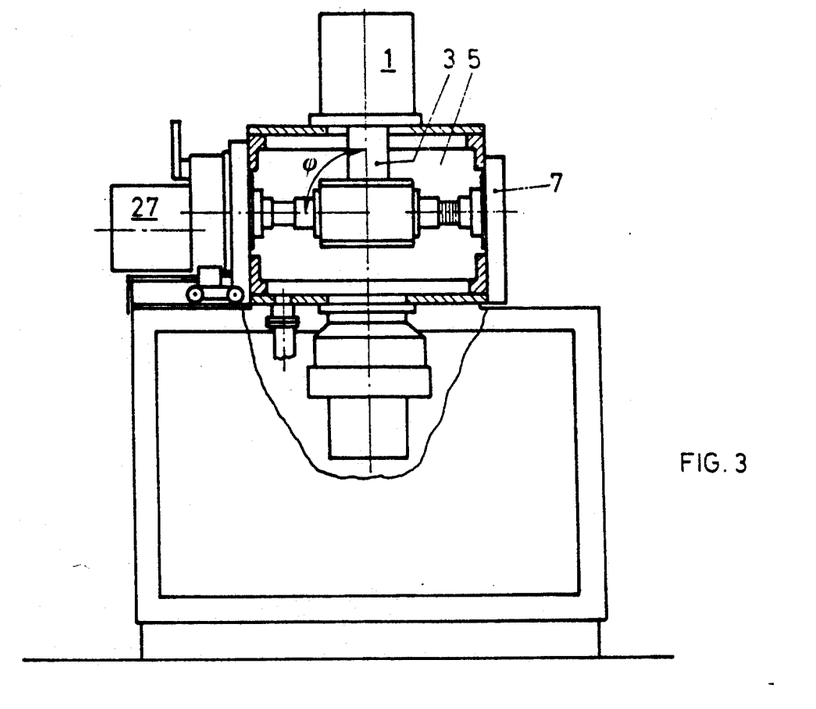
FIG. 3 is an illustration of an apparatus according to FIG. 2 or 4, resp. having a trajectory cone surface with a cone angle of the cone of $\phi=90°$ with respect to the cone axis, shown partly in section.

FIG. 3 illustrates partly in section an apparatus in which the arms 5 project perpendicularly from the axis 3 of the motor, thus defining for a cone angle $\phi$ of 90°.

Figure 4:
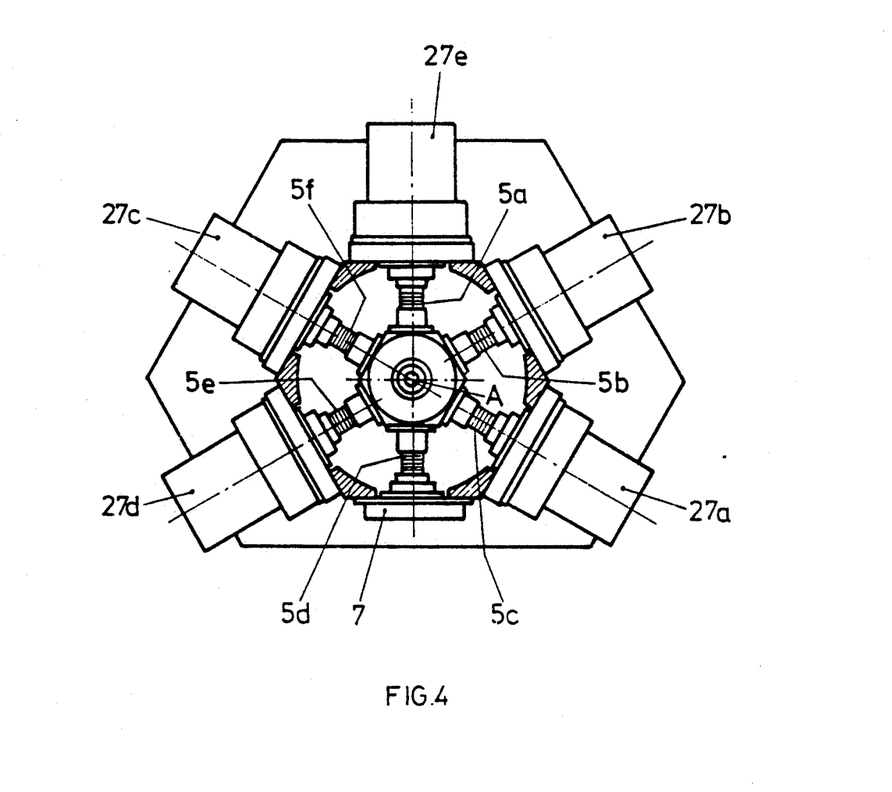
FIG. 4 is a schematic top view in the direction of the rotational axis of the apparatus according to FIG. 3.

A top view of the apparatus according to FIG. 3 is illustrated in FIG. 4. The same structural members are identified by the same reference numerals. For instance six transport arms 5a to 5f are arranged around the axis A, analogue as illustrated in FIG. 3. They serve alternatingly a lock station 7 for the charging and removing of e.g. the disks 21 and five further processing stations 27a to 27e.

Figure 5:
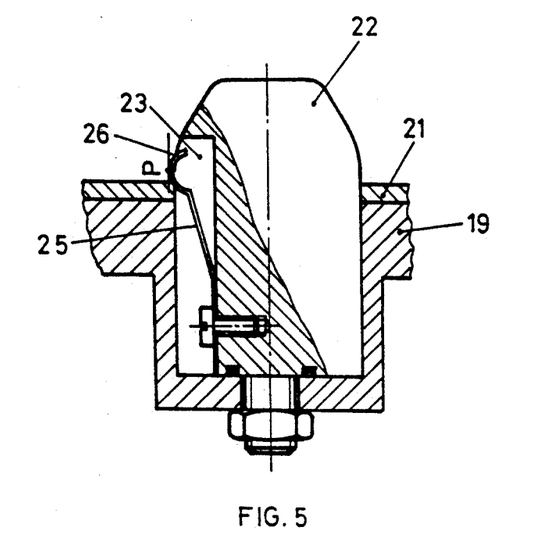
FIG. 5 shows the transport device for disk-shaped articles at an apparatus according to FIGS. 2 to 4.

In order to treat disk shaped articles such as CD's or magneto-optical disks having a central hole, such as the disk 21 illustrated in FIG. 2, FIG. 5 illustrates a preferred support on the plate 19. Thus, the plate 19 includes at its center a pin 22 which has three axially extending grooves 23 staggered azimutally by 120°. Springs 25 are mounted in these grooves. They project towards the upright end of the pin with portions 26 slightly domed outwards beyond the outer surface of the pin, such that the disk 21 can be easily slid e.g. by means of a charging roboter over these portions and a slight snapping occurs at the portions 26. This depends from how much the portions 26 will project over the deposited disk 21. This slight snapping-on by the disk 21, only slightly over the culmination point P of the portions 26, allows also a more easy drawing-off of the disk 21 after its processing or treatment, resp. without that a drive mechanism being necessary for the retaining springs 25.

Figure 6:
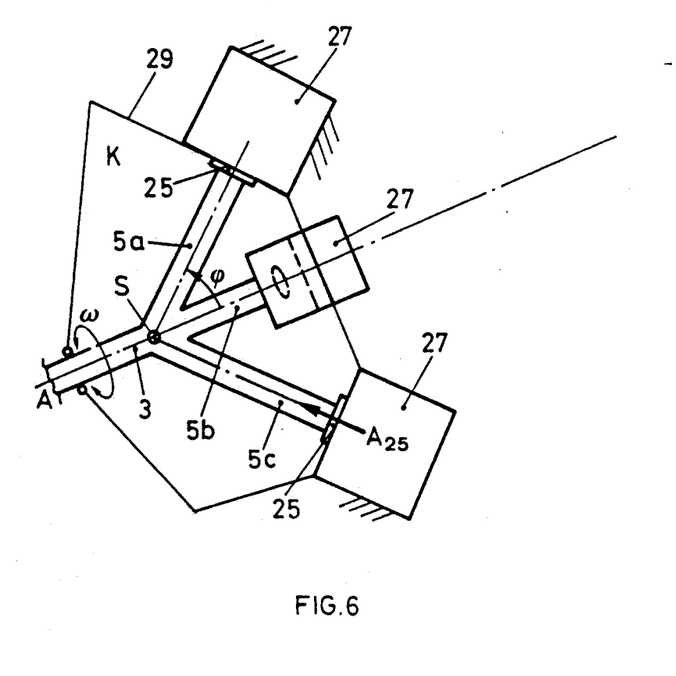
FIG. 6 illustrates schematically the principle of the inventive apparatus according to FIGS. 2 to 5.

The basic principle of the apparatus explained with reference to FIGS. 2 to 4 is schematically illustrated in FIG. 6. By means of the here e.g. three illustrated transport arms 5a to 5c which rotate around the rotational axis A, the indicated exemplarily three stations 27 with their openings are served. In the manner as illustrated by the limiting line 29 a transport device chamber K may be formed. During its rotation ω the transport device sweeps over a conical surface having a cone angle φ and serves the stations 27 of which the openings 25 determine the surface normal $A_{25}$. Latter are directed in the direction of generatrix lines of the cone which is swept over. The openings 25 of the stations 27 are located on a great circle of the cone trajectory surface which is swept over, i.e. all have the same distance from the tip S of that cone surface.

Figure 7:
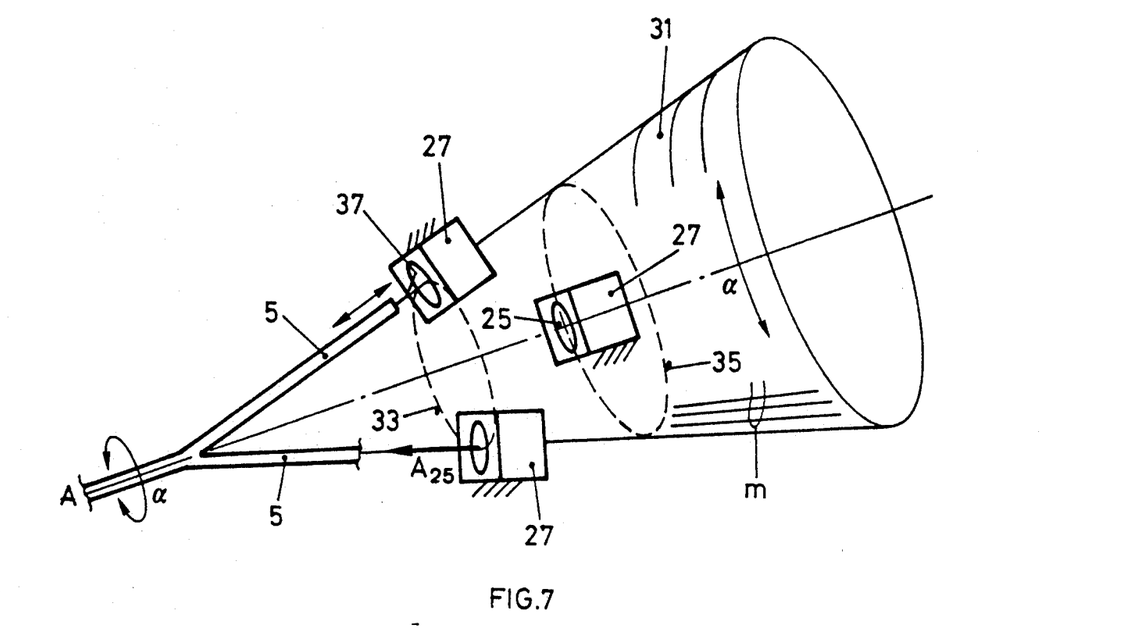
FIG. 7 is a schematic illustration analogue to FIG. 6 of a further embodiment of the inventive apparatus.

In FIG. 7 a further embodiment of the apparatus is schematically illustrated. Here, stations located along the illustrated trajectory cone surface 31 swept over by the arms, are positioned on a first great circle 33 and further stations of which only one is illustrated are located on a second great circle 35. The surface normals $A_{25}$ of the openings extend again in direction of the generatrix lines m of the cone 31. In order to serve the openings 25 of stations 27 which are located on different great circles 33, 35 the arms 5 can be drivingly elongated or shortened such as schematically shown at 37, such as for instance by a pneumatic telescope drive, e.g. covered by a here not illustrated bellows, analogue to the bellows 23 of FIG. 2. Accordingly, it becomes possible to position stations not only on one great circle such as in the apparatus according to FIGS. 2 to 4, but staggered azimutally, α, on a plurality of great circles of the cone 31.

Figure 8:
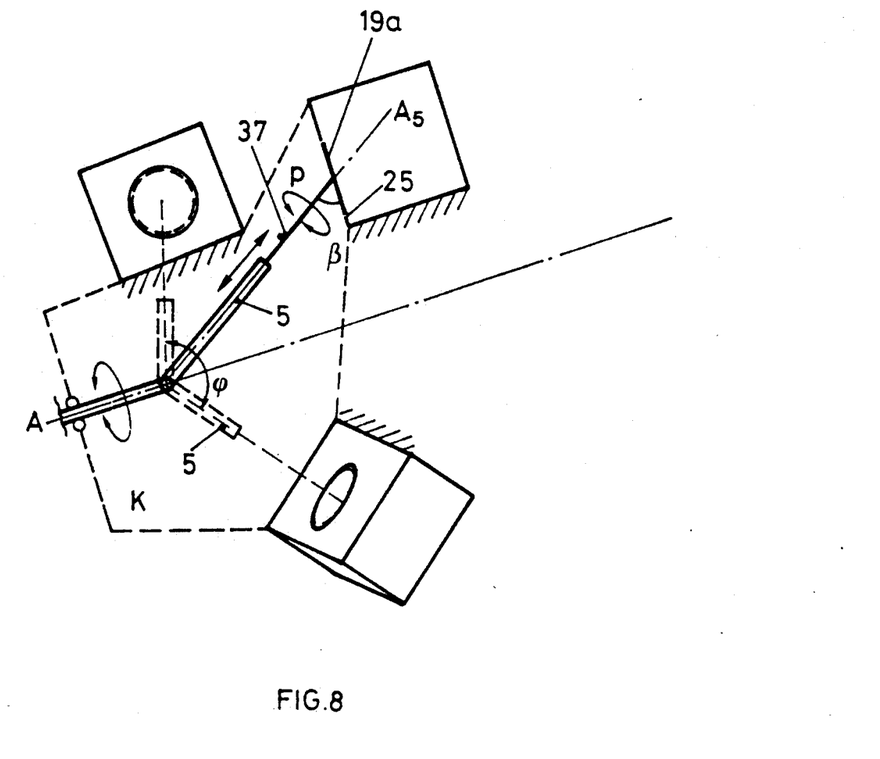
FIG. 8 is an illustration in accordance with FIGS. 6 or 7 of a still further embodiment of the inventive apparatus.

In a further embodiment of the invention according to FIG. 8 the arms can also be elongated or shortened as again shown at 37 and carry a conveyor plate 19a. Additionally, the angle φ of the trajectory cone is adjustable e.g. in a driven manner such that it is possible to sweep over respective cones having different cone angles φ. Accordingly, it is possible to serve stations located arbitrarily within large limits. Additionally, the conveyor plate 19a is supported angularly at an angle $\beta \leq 90°$ at the respective arm 5 and, such as illustrated by p, rotatable around the arm axis $A_5$. The setting of the cone angle φ of the elongating or shortening of the arm and of the rotating amount at p, as well, is preferably accomplished drivingly controlled such that it becomes possible to serve by such an arrangement stations with their openings 25 which are practically positioned arbitrarily regarding their orientation and distribution in space. The preferably foreseen chamber K of the transport device is again indicated by broken lines.

Figure 9:
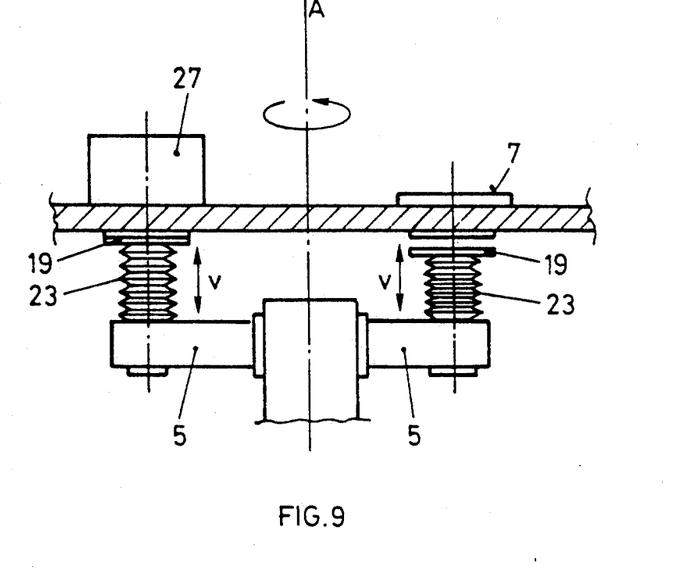
FIG. 9 illustrates schematically a further embodiment of the inventive apparatus.

According to FIG. 9 the rotational axis A lies vertically. The arms 5 are L-shaped and mounted so that the conveyor plates 19 lie horizontally. This has the substantial advantage that thus articles on the plates must not be fastened or held, resp. The drive means at the arms for the movement of the plates are positioned inside of bellows 23.

By the inventive concept and a correspondingly designed vacuum process apparatus, it becomes possible to design extremely compact apparatuses having a plurality of individual process stations including load locks, whereby looking back to FIG. 2 it follows automatically that, if desired, optimally short conveyance paths may be realized or the volumes to be conditioned can be minimalized, resp.

While there are shown and described present preferred embodiments of the invention it is to be distinctly understood that the invention is not limited thereto, but may be otherwise variously embodied and practiced within the scope of the following claims.

I claim:

1. A vacuum process apparatus for processing at least one workpiece, comprising a chamber with:
   at least two openings defining respective opening areas for one of treating and handling said at least one workpiece thereat;
   a transport device, comprising
   a drive shaft rotatable around a rotational axis of said drive shaft;
   at least two conveyors arranged at said transport device for at least one workpiece each, said transport device comprising a transport arm for each conveyor projecting from said drive shaft;
   said arms being operatively coupled to said conveyors to move said conveyors relative to said shaft.

2. The apparatus of claim 1, said openings defining an opening area each, with normals on said opening areas being warped with respect to said rotational axis.

3. The apparatus of claim 1, wherein said conveyors are movable at least one of parallel to said drive shaft and of normally with respect to said drive shaft.

4. The apparatus of claim 1, wherein said conveyors, once positioned adjacent one of said openings by rotation of said transport device, are movable towards and from said opening in a normal direction of said opening areas.

5. The apparatus of claim 1, wherein rotation of said transport device around said rotational axis substantially define a cone shaped trajectory surface with a cone opening angle with respect to said rotational axis of not more than 90°.

6. The apparatus of claim 5, wherein each of said openings defines an opening area, with normals on said opening areas pointing in a direction of respective generatrix of said cone-shaped trajectory surface.

7. The apparatus of claim 6, wherein said openings are arranged along a circle cut by said cone-shaped trajectory surface by a geometric plane arranged perpendicularly to said rotational axis.

8. The apparatus of claim 1, said transport device residing within said chamber further comprising at least one of a load lock chamber and of a station for treating said workpiece communicating by one of said openings with said chamber.

9. The apparatus of claim 8, further comprising gas inlet means and pumping means at least at one of said station and chambers.

10. The apparatus of claim 1, wherein at least one of said conveyors comprise a seal member for sealingly closing one of said openings when said at least one conveyor is rotated adjacent to said opening by said transport device.

11. The apparatus of claim 10, wherein said seal member is formed by a conveyor plate for said workpiece.

12. The apparatus of claim 1, wherein each said conveyor comprises a conveyor plate with a projecting positioning pin for positioning a disk shaped workpiece with a central bore.

13. The apparatus of claim 12, further comprising holding means for said workpiece on said conveyor plate.

14. The apparatus of claim 13, said holding means being formed by spring means acting radially with respect to said pin.

15. The apparatus of claim 1, said workpiece being one of compact disk workpieces and of magneto-optical storage disk workpieces.

16. A vacuum chamber for processing at least one workpiece, comprising at least two openings defining respective opening areas for treating or handling said at least one workpiece thereat; a transport device with a drive shaft for rotating said transport device around a rotational axis of said drive shaft; at least two conveyors arranged at said transport device for the workpiece thereat, said transport device further comprising a transport arm for each conveyor projecting from said drive shaft; said arms being operatively coupled to said conveyors to move said conveyors relative to said shaft.

17. The chamber of claim 16, wherein each of said openings defines an opening area with, normals on said opening areas being warped with respect to said rotational axis.

18. The chamber of claim 16, wherein said conveyors are movable at least one of parallel to said rotational axis and of normally with respect to said rotational axis.

19. The chamber of claim 16, wherein said conveyors, once positioned adjacent one of said openings by rotation of said transport device, are movable towards and from said opening in a normal direction of said opening areas.

20. The chamber of claim 16, wherein rotation of said transport device around said rotational axis substantially defines a cone-shaped trajectory surface with a cone opening angle with respect to said rotational axis of not more than 90°.

21. The chamber of claim 20, wherein each of said openings define an opening area with, normals on said opening areas pointing in a direction of respective generatrix of said cone-shaped trajectory surface.

22. The chamber of claim 21, wherein said openings are arranged along a circle intersected by said cone-shaped trajectory surface by a geometric plane arranged perpendicular to said rotational axis.

23. The chamber of claim 16, wherein at least one of said conveyors comprise a seal member for sealingly closing one of said openings when said at least one conveyor is rotated adjacent to said opening by said transport device.

24. The chamber of claim 23, wherein said seal member is formed by a conveyor plate for said at least one workpiece.

25. The chamber of claim 16, wherein said conveyors comprises a conveyor plate with a projecting positioning pin for positioning a disk shaped workpiece with a central bore.

26. The chamber of claim 25, further comprising holding means for said at least one workpiece on said conveyor plate.

27. The chamber of claim 16, wherein said holding means is formed by spring means acting radially with respect to said pin.

28. The chamber of claim 16, wherein said conveyors are configured to hold workpieces in the form of one of compact disk workpieces and of magneto-optical storage disk workpieces.

29. The chamber of claim 16, wherein said conveyors comprise a support plate with an upstanding pin; spring loaded holding portions around said pin being biased radially outwardly with respect to said pin, and further comprising holding portions projecting outwardly with respect to said pin and being biased slightly outside the surface of said pin.

* * * * *